(12) United States Patent
Karpovich et al.

(10) Patent No.: US 9,082,913 B2
(45) Date of Patent: Jul. 14, 2015

(54) SOLAR PANEL HOUSING

(75) Inventors: Jon Karpovich, Pinckney, MI (US);
Reynold Hendrickson, Ann Arbor, MI (US); Rajul L. Patel, Canton, MI (US)

(73) Assignee: Rajul R. Patel, Canton, MI (US)

( * ) Notice: Subject to any disclaimer, the term of this patent is extended or adjusted under 35 U.S.C. 154(b) by 0 days.

(21) Appl. No.: 13/444,842

(22) Filed: Apr. 11, 2012

(65) Prior Publication Data
US 2012/0262040 A1    Oct. 18, 2012

Related U.S. Application Data

(60) Provisional application No. 61/474,277, filed on Apr. 12, 2011.

(51) Int. Cl.
*H01L 31/0203* (2014.01)
*H01L 23/24* (2006.01)
*H01L 31/024* (2014.01)
*H01L 31/048* (2014.01)
*F24J 2/46* (2006.01)
*H02S 30/10* (2014.01)
*H02S 20/23* (2014.01)
*H02S 40/44* (2014.01)
*F24J 2/50* (2006.01)

(52) U.S. Cl.
CPC .............. *H01L 31/048* (2013.01); *F24J 2/465* (2013.01); *F24J 2/4641* (2013.01); *F24J 2/4643* (2013.01); *F24J 2/4647* (2013.01); *H02S 20/23* (2014.12); *H02S 30/10* (2014.12); *H02S 40/44* (2014.12); *F24J 2002/502* (2013.01); *Y02B 10/12* (2013.01); *Y02E 10/40* (2013.01); *Y02E 10/50* (2013.01); *Y02E 10/60* (2013.01)

(58) Field of Classification Search
CPC ..................... H01L 31/0424; H01L 31/052
USPC ................... 136/251, 248; 52/173.3
See application file for complete search history.

(56) References Cited

U.S. PATENT DOCUMENTS

| | | |
|---|---|---|
| 3,995,615 A | 12/1976 | Hojnowski |
| 4,033,325 A | 7/1977 | Walker |
| 4,099,517 A | 7/1978 | McRae |
| 4,156,419 A | 5/1979 | Lewis, Sr. |
| 4,167,935 A | 9/1979 | Severson |
| 4,226,256 A | 10/1980 | Hawley |
| 4,278,074 A | 7/1981 | Uroshevich |
| 4,289,113 A * | 9/1981 | Whittemore .............. 126/570 |

(Continued)

FOREIGN PATENT DOCUMENTS

| | | | | |
|---|---|---|---|---|
| JP | WO2010013691 | * | 2/2010 | ............. 136/251 |
| WO | WO2009137348 | * | 11/2009 | ............. 136/251 |

*Primary Examiner* — Jonathan Johnson
*Assistant Examiner* — Bethany L Martin
(74) *Attorney, Agent, or Firm* — Mastrogiacomo PLLC

(57) ABSTRACT

A housing for a solar panel is provided that includes a glazed element and a tray, the tray including a plate, side walls a top end cap, a bottom end cap, a top surface and a lip, the lip configured to seat the glazed element, wherein the tray is formed of a single material, wherein the plate, the side walls, the top and the bottom end cap are collectively configured to form a cavity, and wherein the top end cap includes a top header, the top end cap positioned between the top header and the cavity and including at least one pipe extending outwardly from the top header at both side ends and extending a length and throughout an interior space of the to header, and at least one void extending a length and throughout the interior space of the to header, the void positioned proximate the pipe.

15 Claims, 12 Drawing Sheets

(56) References Cited

U.S. PATENT DOCUMENTS

| | | | |
|---|---|---|---|
| 4,289,120 A | 9/1981 | Ward | |
| 4,300,535 A * | 11/1981 | Munroe | 126/666 |
| 4,331,492 A | 5/1982 | Dominguez et al. | |
| 4,350,145 A | 9/1982 | Bianchini | |
| 4,377,156 A | 3/1983 | Schelzig | |
| 4,493,940 A * | 1/1985 | Takaoka | 136/248 |
| 4,498,265 A | 2/1985 | Leflar et al. | |
| 4,505,261 A | 3/1985 | Hunter | |
| 4,966,655 A | 10/1990 | Wilkerson | |
| 5,408,990 A | 4/1995 | Edling et al. | |
| 5,411,015 A | 5/1995 | Starnes | |
| 5,440,849 A * | 8/1995 | Agrawal et al. | 52/393 |
| 5,522,944 A * | 6/1996 | Elazari | 136/248 |
| 5,551,991 A | 9/1996 | Avero | |
| 5,596,981 A | 1/1997 | Soucy | |
| 5,645,045 A | 7/1997 | Breslin | |
| 6,047,697 A | 4/2000 | Best | |
| 6,066,797 A | 5/2000 | Toyomura et al. | |
| 6,196,216 B1 | 3/2001 | Kooij | |
| 6,414,237 B1 | 7/2002 | Boer | |
| 6,722,358 B2 | 4/2004 | Rhodes | |
| 6,807,963 B1 | 10/2004 | Miedermeyer | |
| 6,814,070 B2 | 11/2004 | Bourne et al. | |
| 6,968,654 B2 | 11/2005 | Moulder et al. | |
| 7,604,003 B2 | 10/2009 | Merrett | |
| 8,191,321 B2 * | 6/2012 | McClellan et al. | 52/173.3 |
| 2004/0182432 A1 * | 9/2004 | Yoda et al. | 136/244 |
| 2006/0124167 A1 * | 6/2006 | Fan et al. | 136/251 |
| 2007/0039611 A1 * | 2/2007 | Benvenuti | 126/652 |
| 2008/0098750 A1 * | 5/2008 | Busier | 62/3.3 |
| 2008/0302030 A1 * | 12/2008 | Stancel et al. | 52/173.3 |
| 2009/0205704 A1 | 8/2009 | Flaherty et al. | |
| 2011/0100436 A1 * | 5/2011 | Cleereman et al. | 136/251 |
| 2011/0126888 A1 * | 6/2011 | Naitoh et al. | 136/251 |
| 2011/0186109 A1 * | 8/2011 | Elazari | 136/248 |

* cited by examiner

SOLAR PANEL HOUSING

CROSS REFERENCE TO RELATED APPLICATIONS

This patent application claims the benefit of priority based on U.S. Provisional Patent Application No. 61/474,277 filed on Apr. 12, 2011, which is incorporated by reference in its entirety for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON COMPACT DISC

Not Applicable

BACKGROUND OF THE INVENTION

1. Field of the Invention

The present invention relates generally to solar panels for converting solar energy into electrical and thermal energy and, more particularly, to a lightweight and inexpensive solar panel housing.

2. Background Art

As the world demand for natural resources, such as petroleum oil, petroleum products, natural gas, coal and the like, continues to rise, there is an ever increasing need to identify and use alternative forms of energy in an attempt to conserve what remains of a finite supply of natural resources. Alternative forms of energy are in use today and may include water or hydro, wind, and solar power to name a few. Of these alternative forms of energy, most often, solar power is seen as one of the most abundant forms of renewable energy.

Generally, solar power may be collected from the sun and transformed into electrical or thermal energy through the use of solar panels. Photovoltaics are typically used to collect solar energy and covert the solar energy directly into electricity. Many photovoltaics may be connected to form a solar panel. Many solar panels may be arranged in an array on the tops of buildings or on the ground and are generally required to produce enough electrical energy to supply electrical power to a building.

Alternatively, solar panels may be used to change the sun's solar energy into thermal energy to heat water that may be used for bathing, washing and swimming. As with photovoltaic solar panels, thermal solar panels may be arranged in an array on the roof or a building or on the ground such that each of the panels may be connected together through plumbing to allow water or other fluids to circulate through the pipes of the panels. As the water or other fluids circulate through the pipes and solar panels, the solar energy captured by the thermal panels will increase the temperature in the water or other fluids. The heated water or fluids may then been stored or used right way.

Although solar energy is quite useful and abundant, presently the conversion from solar energy to electricity is quite inefficient. Because of this inefficiency, many photovoltaic panels are connected together through an array of solar panels, as described above, such that enough solar energy may be collected and converted to electrical power to operate lighting and appliances in a home. In commercial applications, there is a need for even more solar panels to collect and convert enough electrical energy to operate a large commercial building.

While the conversion from solar energy to thermal energy may be done so more efficiently than the conversion of solar energy to electrical energy, there is still a need to use an array of solar panels to convert the sun's energy to heat fluids for a building or home. As with photovoltaic panels, a number of solar panels are needed to facilitate an adequate thermal energy transfer to heat a sufficient amount of water for use.

Often, the sizes of these solar panels are very large to accommodate the electrical or thermal internals required for energy transfer and they may weigh tens of pounds. Typically, a commercial solar panel may be as large as four feet in width by eight feet in length. The housing of the solar panels are generally fabricated from a metal, such as steel, aluminum and the like, to provide rigidity and structure to the panel and to protect the internal energy transfer components from the elements of rain, wind, snow and the like. The metal housing or trays contribute to the weight of the panel and often make the panels difficult to manipulate as they are installed and often add a significant amount of weight to a non-load bearing roof.

Another drawback with present day solar panel designs is that they may be only used in daylight hours when the sun is shining to transfer solar energy to solar or thermal energy. Solar panels provide no functional benefit during the night hours. Providing a means to use the solar panels during the evening will further improve the efficiency of the solar panels, lower the costs of energy use and ultimately help to ensure we conserve our natural resources.

Therefore, a need exists for a lightweight and inexpensive solar panel housing that may be used in conjunction with a solar panel for converting solar energy from the sun into useful electrical or thermal energy. Also, there exist a need for a solar panel housing that may be manufactured such that components of the solar panel may be used during night hours or times of little or no sunlight.

BRIEF SUMMARY OF THE INVENTION

A housing for a solar panel is provided that includes a glazed element and a tray, the tray including a plate, a pair of side walls extending generally vertical from the plate, the pair of side walls include at least one first aperture, the at least one first aperture configured to allow passage of a tube or conduit, a top end cap, a bottom end cap, a top surface of the pair of side walls, the top end cap and the bottom end cap, a lip, the lip positioned proximate the junction of the top surface of the pair of side walls, the top end cap and the bottom end cap and an interior wall of the pair of side walls, the top end cap and the bottom end cap, the lip including a seating surface that is positioned below the top surface of the pair of side walls, the top end cap and the bottom end cap, the lip extending the interior perimeter of each of the pair of side walls, the top end cap and the bottom end cap, and the lip configured to seat the glazed element such that a top surface of the glazed element is flush to the top surface of the pair of side walls, the top end cap and the bottom end cap wherein the plate, the pair of side walls, the top end cap, the bottom end cap, the top surface of the pair of side walls, the top end cap and the bottom end cap and the lip are formed of a single material and configured as a single integral component wherein the plate, the pair of side walls, the top end cap and the bottom end cap are collectively configured to form a cavity; and wherein the top end cap is configured to include a top header, the top header configured such that the top end cap is positioned between the top header and the cavity, the to header including at least one pipe extending outwardly from the top header at both side ends of the top header and extending a length of the top header and throughout an interior space of the top header, and at least one void extending a length of the top header and throughout the interior space of the top header, the void positioned proximate the pipe and distinct from the pipe.

BRIEF DESCRIPTION OF THE SEVERAL VIEWS OF THE DRAWINGS

The features and inventive aspects of the present invention will become more apparent from the following detailed description, claims, and drawings, of which the following is a brief description:

DETAILED DESCRIPTION OF THE INVENTION

Figure 1:
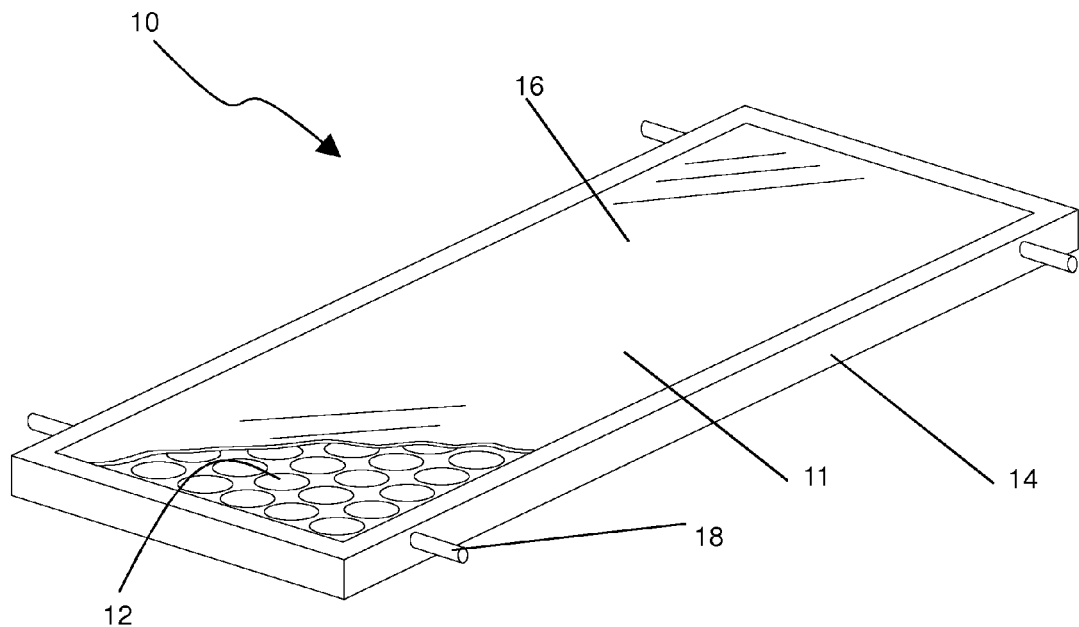
FIG. 1 is a perspective view of a solar panel according to an embodiment of the present invention.

Referring now to the drawings, preferred illustrative embodiments of the present invention are shown in detail. Although the drawings represent embodiments of the present invention, the drawings are not necessarily to scale and certain features may be exaggerated to better illustrate and explain the present invention. Further, the embodiments set forth herein are not intended to be exhaustive or otherwise to limit or restrict the invention to the precise forms and configurations shown in the drawings and disclosed in the following detailed description.

Now referring to the drawings, a solar panel 10 is illustrated in FIG. 1. This particular solar panel 10 may be used to generate electrical power from the solar energy supplied by the sun. Solar panel 10 includes an array of photovoltaic cells 12 that may be arranged and positioned in a housing 11. Housing 11 may be rectangular in shape and sized to accommodate a number of photovoltaic cells 12. Housing 11 includes a tray 14 and a piece of glazing 16, such as glass, low thermal emissivity glass, Halar® and the like, that covers much of tray 14 to enclose cells 12. A conduit 18 may extend from each of four corners of housing 11 such that electrical wiring may extend from photovoltaic cells 12 of panel 10 out through conduit 18. Conduit 18 will provide means to connect the electrical wiring of an array of panels 10 together so that more than one panel 10 may be electrically connected together as well as allowing for electrical connections into the building such that the electrical power generated by panel 10 may be supplied to the buildings for generating light, operating appliances and the like.

Figure 2:
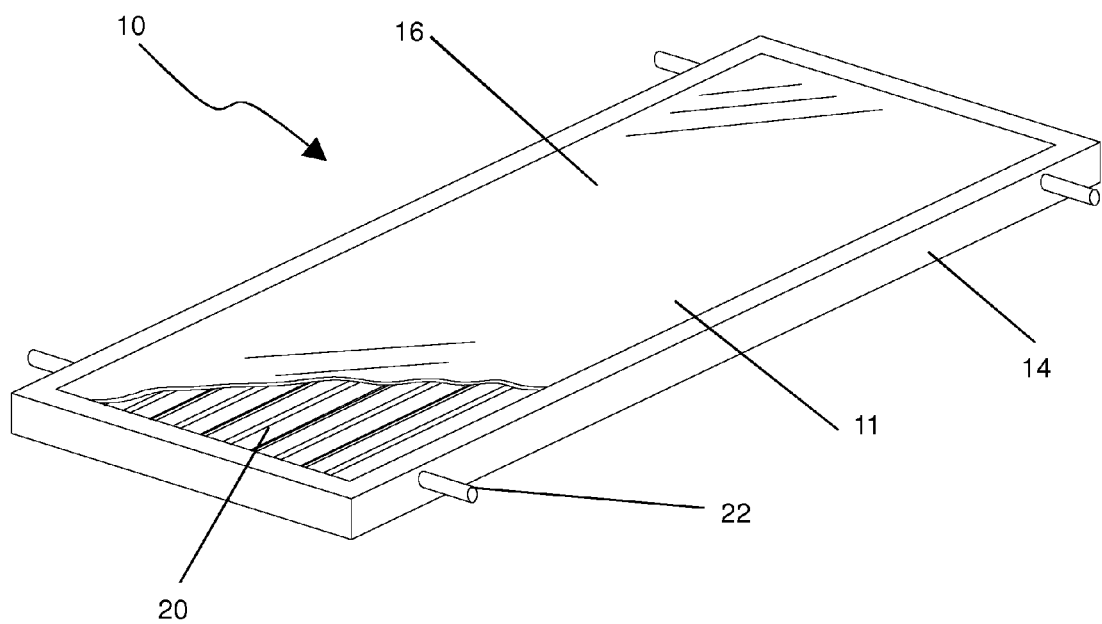
FIG. 2 is a perspective view of a solar panel according to another embodiment of the present invention.

Solar Panel 10 may also be used to generate thermal energy from the solar energy supplied by the sun for the heating of fluids, such as water. FIG. 2 illustrates solar panel 10 that is configured with a number of fin tubes 20 rather than photovoltaic cells 12. Fin tubes 20 are configured to allow fluids to flow through them. Fin tubes 20 are heated by the solar energy supplied by the sun which, in turn, transfers the heat to the fluid within tubes 20. Pipes 22 may extend from each of four corners of housing 11 so that more than a one panel may be connected together as well as allowing for plumbing connections into the building such that fluid heated by panel 10 may be supplied to buildings for use in bathing, swimming, cleaning and the like.

Figure 3:
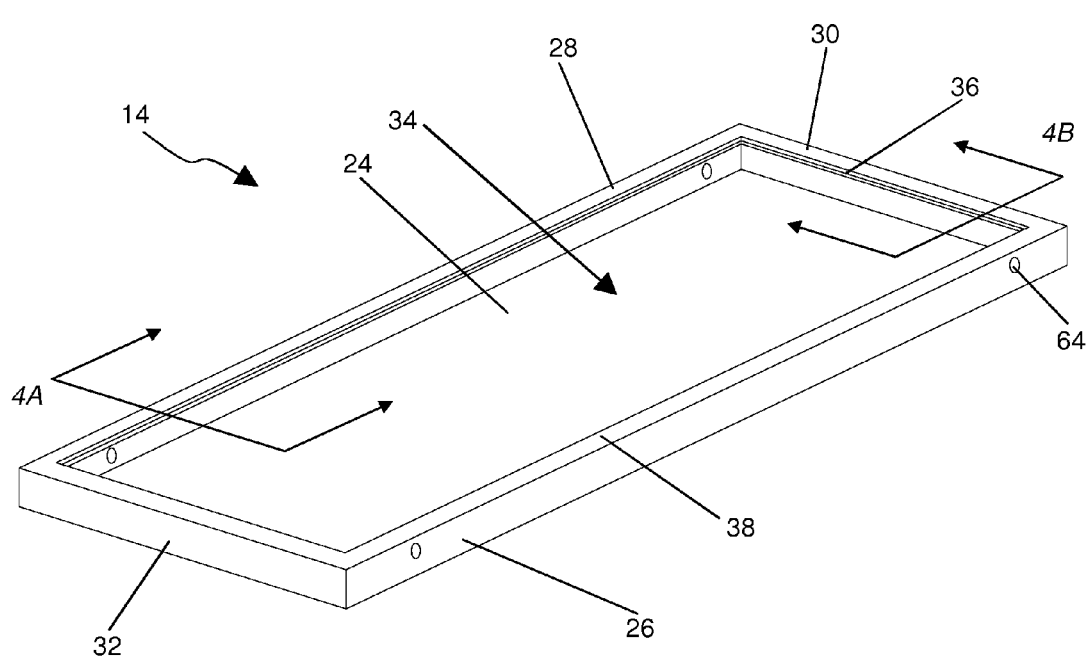
FIG. 3 is a perspective view of a solar panel housing according to an embodiment of the present invention.

According to an embodiment of the present invention, tray 14 is shown in FIG. 3 and includes a bottom plate 24 and a pair of side walls 26 and 28. Tray 14 further includes a top surface 38 as well as a top end cap 30 and a bottom end cap 32. Plate 24, side walls 26 and 28, top end cap 30 and bottom end cap 32 may be configured to create a cavity 34 to house components of solar panel 10.

Each of the pieces of tray 14 may be manufactured from foam such as polystyrene and the like and assembled together with glazing 16 to produce a very light weight housing 11 for encasing photovoltaic cells 12 or fin tubes 20. Any number of processes may be used to manufacture each of the pieces, such as cutting each piece from a block of material, blow molding each of the pieces, forming each piece from the material, injection molding, rotational molding and like processes. The foam tray may then be encased in a coating, such a polyurea, to strengthen tray 14 and to protect the tray from the weather elements. Manufacturing tray 14 in this manner will help to decrease the weight of housing 11 and solar panel 10 versus conventional metal panels that are widely known in the art. Although tray 14 has been described above as being manufactured from a foam product, tray 14 may easily be manufactured from any materials such as any type of plastic, woods, metals, ceramics and the like and yet still maintain light weight properties.

Figure 4A:
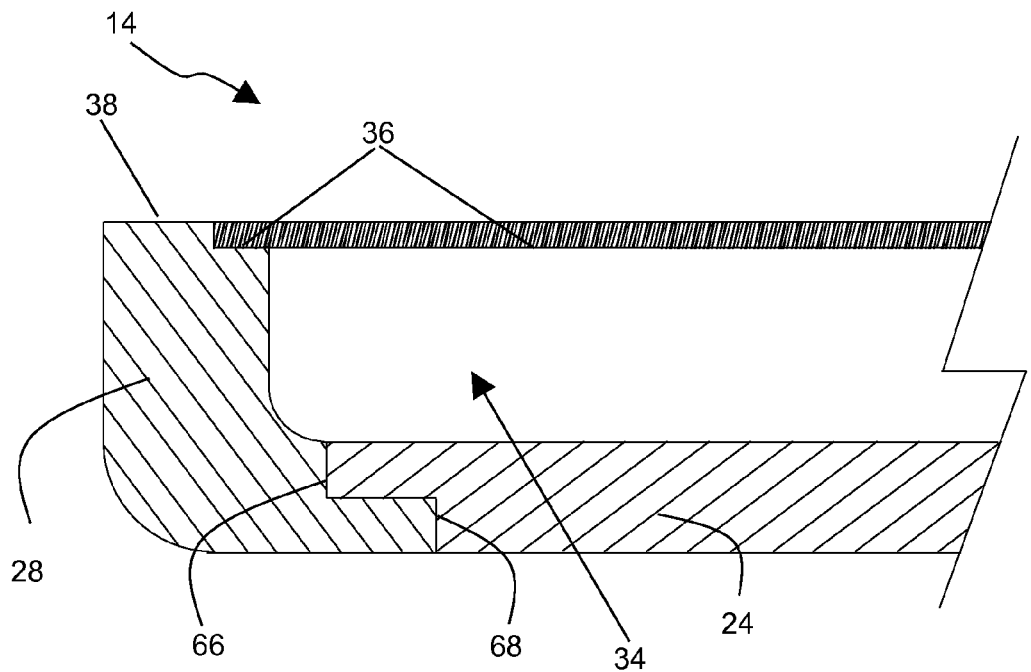
FIG. 4A is a cross-sectional view of a solar panel housing according to an embodiment of the present invention.
Figure 4B:
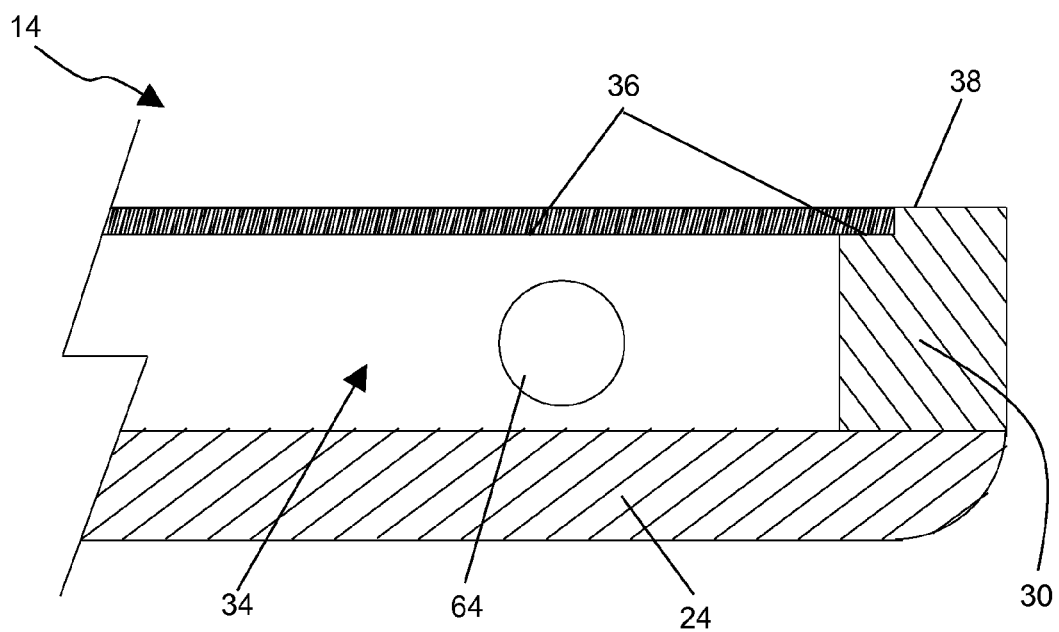
FIG. 4B is a cross-sectional view of a solar panel housing according to another embodiment of the present invention.

Now referring to FIG. 4A, a typical cross-section of tray 14 is shown to illustrate side wall 28 (typical for side wall 26). Side walls 26 and 28 each include a lip 36 that extends the length of each of walls 26 and 28 near a top surface 38. Side walls 26 and 28 further include an interior wall 29 as well as a first step joint 66 for accepting a second step joint 68 of plate 24 to provide a secure and sealed joint between side walls 26 and 28 and plate 24. FIG. 4B illustrates a typical cross section of top end cap 30 (typical for bottom end cap 32). Both top end cap 30 and bottom end cap 32 include an interior wall 29 as well as lip 36 near top surface 38, such that when tray 14 is assembled, lip 36 extends the inside perimeter of side wall 26 and 28, top end cap 30 and bottom end cap 32. Lip 36 includes a seating surface 37 that is positioned below top surface 38. Lip 36 may be configured in this manner and sized to accept and seat glazing 16 such that a top surface 17 of glazing 16 is flush to top surface 38 and cavity 34 and housing 11 may be sealed to protect the solar components. Also illustrated by FIG. 4B is an aperture 64 that may be sized to accept conduit 18 or tube 22 and may be positioned proximate each of the four corners of tray 14.

Figure 4C:
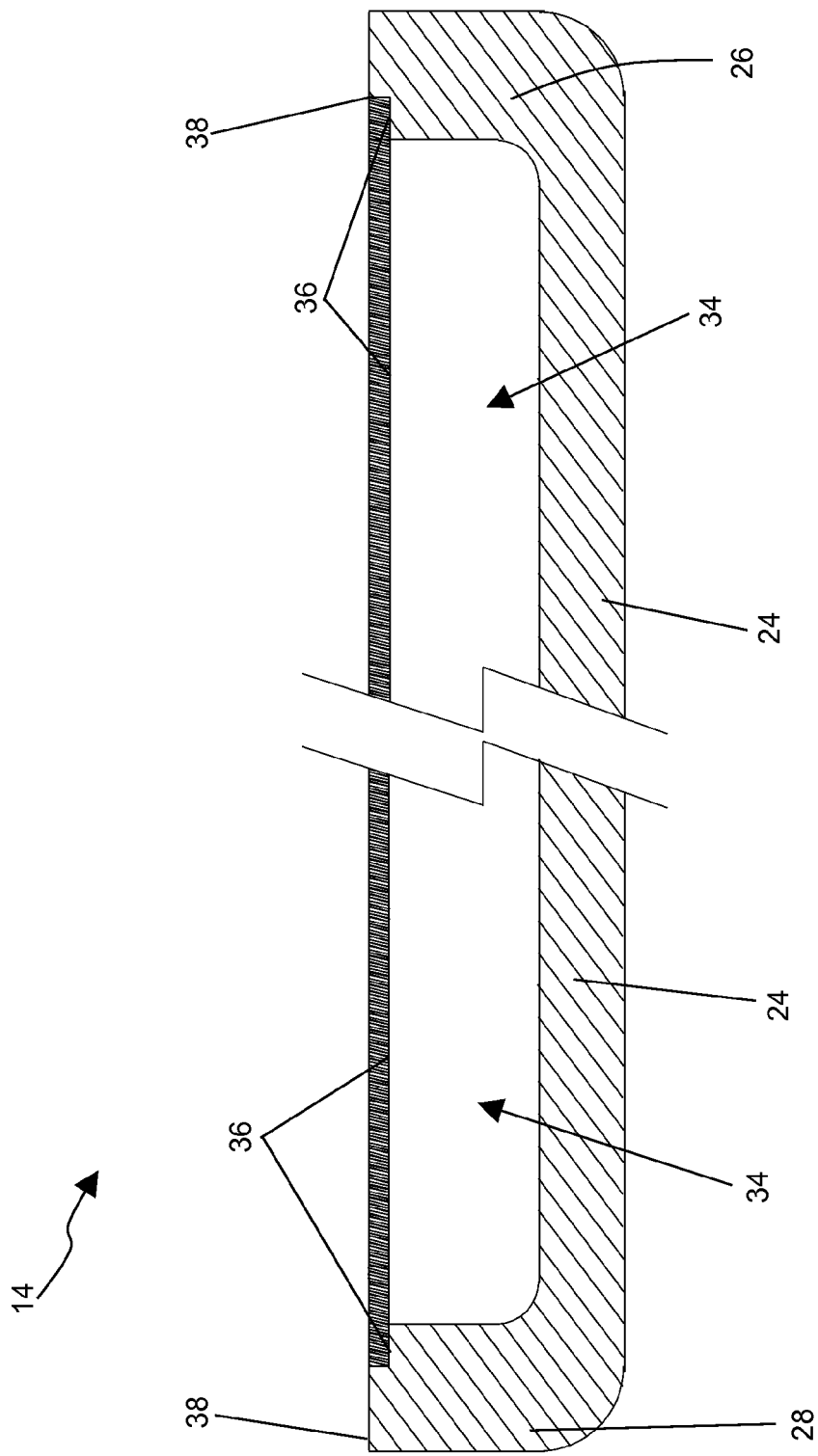
FIG. 4C is a cross-sectional view of a solar panel housing according to yet another embodiment of the present invention.

Alternatively, side walls 26 and 28 may be designed such that they manufactured with bottom plate 24 as one piece. In this particular embodiment of the present invention illustrated in FIG. 4C, side walls 26 and 28 extend generally perpendicular outward from bottom plate 24. Plate 24 and side walls 26 and 28 may be manufactured in this manner to streamline the assembly process of tray 14. Top end cap 30 and bottom end cap 32 may be assembled to bottom plate 24 and side walls 26 and 28 in the same manner as above to create cavity 34.

Tray 14 may also be manufactured as a single unitized body having plate 24, side walls 26 and 28, top end cap 30 and bottom end cap 32 all continuously connected together to further reduce assembly costs. The entire tray 14 may be molded or stamped as one piece and be manufactured of plastic, foam such as polystyrene, woods, metals, ceramics and the like and yet still maintain light weight properties.

No matter the manufacturing or assembly process or the materials used to create housing 11, housing 11 may be made in various sizes and shapes. Housing 11 may be manufactured to account for ease of maneuverability during installation, yet allow for a large enough size of solar panel 10 to limit electrical or plumbing connections if a number of panels are being used. Housing 11 may also be designed and manufactured with flexibility to adapt to various roof types and styles as well. For example, a roof may have a curvature that may make mounting a typical solar panel very difficult. Housing 11 may be manufactured in a manner that could accommodate the roof curvature and enable installation of solar panel 10.

Figure 5:
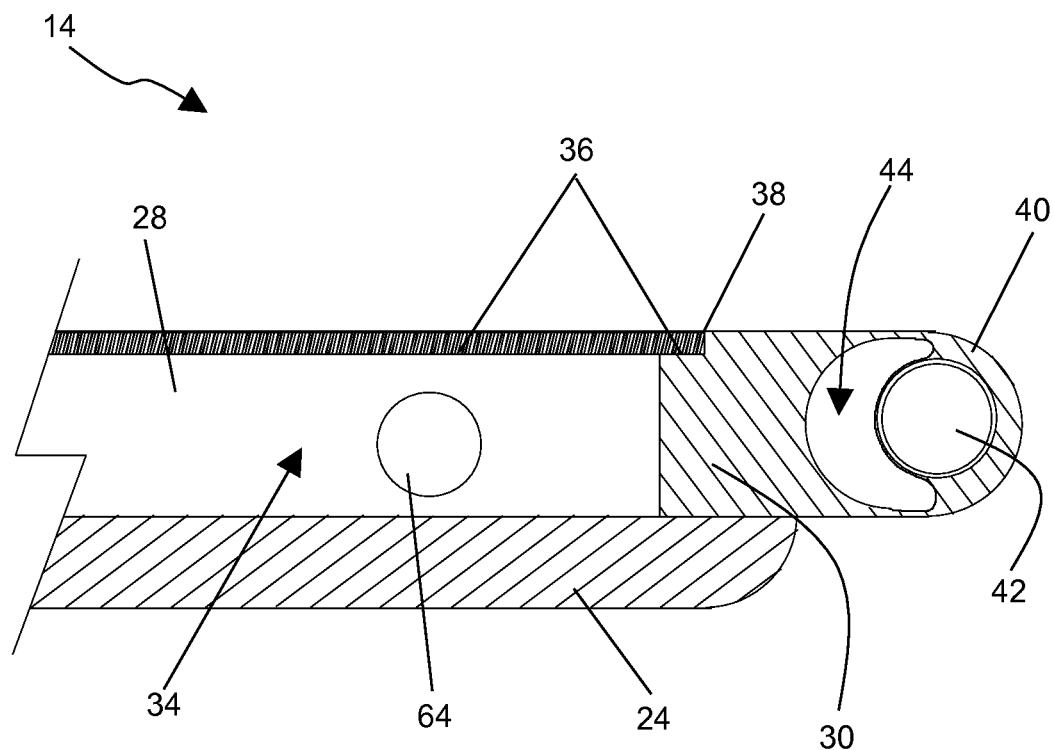
FIG. 5 is a cross-sectional view of a solar panel housing according to another embodiment of the present invention.

Now referring to FIG. 5, tray 14 is illustrated with a top header 40 according to another embodiment of the present invention. In this particular embodiment of the present invention, top end cap 30 may be modified to include a header 40 and provide housing 11 and solar panel 10 with further operational features. Header 40 may include at least one pipe 42 that extends a length of header 40. Pipe 42 may be plumbed into the any conventional plumbing system of a building to allow fluid to flow from the building through pipe 42 of header 40 and back to building. Header 40 may include a void 44 that will allow air to enter header 40, circulate around pipe 42 and exit header 40. Alternatively, header 40 may include another pipe (not shown) for directing an air flow proximate pipe 42. When used in this manner, header 40 may be an air-to-fluid heat exchanger.

In this particular embodiment, housing 11 may be used to take advantage the night air, which may typically be at a lower temperature than the air during the sunlit day. Water or other fluids that may be passed through pipe 42 of header 40 will encounter air that is at a lower temperature then the fluid passing though pipe 42. As with any type of heat exchange, the fluid passing through pipe 42 that is at a higher temperature than the air will begin to lower in temperature and approach the temperature of the air as the temperature of the air increases to that of the fluid temperature. A constant supply of cool air into header 40 through void 44 and around pipe 42 will continue to lower the temperature of the fluid passing though pipe 42. As stated previously, a number of housings 11 and solar panels 10 may be assembled in an array such that the length of pipe 42 may be increased in length to maximize exposure to the air. While header 40 has been described in use with a single pipe 42 for directing a fluid through header 40, it is important to note, however, that multiple pipes may be plumbed through header 40 and, yet, still achieve the same results of cooling heated water.

Providing for means to raise and lower the temperature of the fluid in the above described manner will not only provide means to heat and cool the fluid but also allows for virtually around the clock usage of housing 11 and solar panel 10. Solar panel 10 may be used during sunlight hours to raise the temperature of fluids such as potable water for drinking, swimming, bathing and heating residences and commercial buildings. Solar panel 10 may also be used during the night hours to lower the temperature of fluids such as potable water for drinking, creating ice for storage and use at a later time and cooling residences and commercial buildings.

Figure 6A:
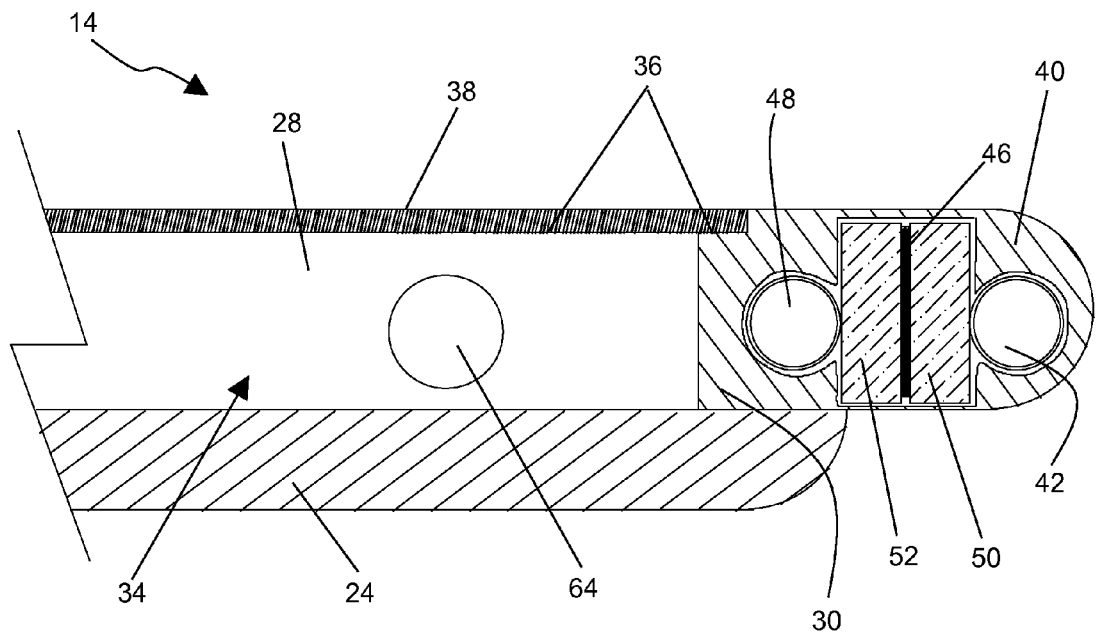
FIG. 6A is a cross-sectional view of a solar panel housing according to still another embodiment of the present invention.

In yet another embodiment of the present invention shown in FIG. 6A, header 40 may be designed to package a pair of plates 50 and 52, electrical hardware 46 (such as a thermoelectric device) and plumbing such that the fluids passing though housing 11 and solar panel 10 may be used to generate electricity. In this particular embodiment of the present invention, a second pipe 48 may be added to header 40. Pipes 42 and 48 may be configured with plates 50 and 52 and electrical hardware 46 to be used in the generation of electricity due to a temperature differential that may be induced in two fluids that will pass through pipes 42 and 48. Electrical hardware 46, plates 50 and 52 that contact pipes 42 and 48 respectively, may generally extend the length of header 40.

Generally, plates 50 and 52 and pipes 42 and 48 will be manufactured of a metal such as copper, steel, aluminum and the like to maximize the heat transfer between the fluids, pipes 42 and 48 and plates 50 and 52. As stated previously, pipe 42 may be plumbed into a supply of building fluids such as city supplied water while pipe 48 may be connected to solar panel 10 for a supply of fluids such as water that may be at higher temperature than the fluids supplied though pipe 42 during daylight hours. As pipe 42 contacts plate 50 and pipe 48 contacts plate 52, a transfer of heat will occur between pipes and plates. Plate 50 will lower in temperature and plate 52 will rise in temperature causing a temperature differential between the plates. The temperature differential will be realized by electrical hardware 46 positioned proximate to plates 50 and 52 thus leading to a generation of electricity. Generation of electricity in this manner is well known in the art. Alternatively, during times of no sunlight, such as during evening hours, the fluids flowing though pipe 48 may be at a lower temperature than the fluids flowing through pipe 42 thus reversing the temperature differential and creating electricity during hours of no sun light. The electricity generated may be used to generate any of the number of pumps used to circulate the fluids throughout the building and array of solar panels 10 or for other electrical accessories requiring power throughout the building such as lighting, televisions and the like.

Figure 6B:
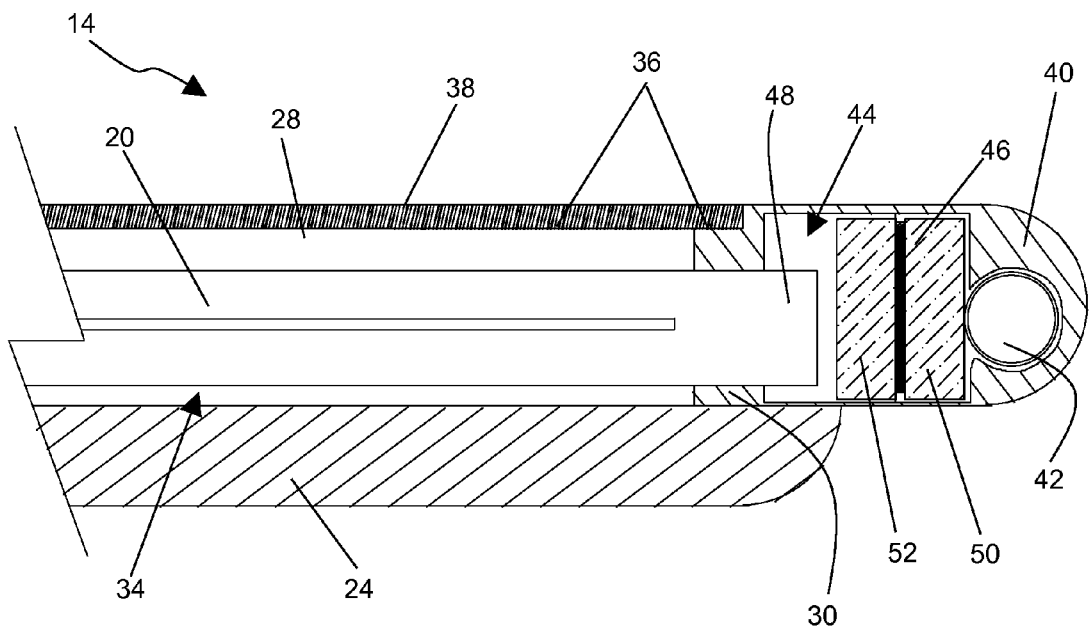
FIG. 6B is a cross-sectional view of a solar panel housing according to yet another embodiment of the present invention.

Alternatively, plate 52 may be directly connected to fin tubes 20 as illustrated in FIG. 6B. In this particular embodiment of the present invention, pipe 48 may be omitted as fin tubes 20 are plumbed and connected directly to plate 52. The heated water from fin tubes 20 will flow directly to plate 52, thereby raising the temperature of plate 52 relative to plate 50, thus enabling the generation of electricity as described above.

While the above improvements to housing 11 have been described with enhancements to top header 40, it is important to note, however, that these same enhancements may be added to a bottom header and side walls and these components work equally as well to heat and cool fluids. Housing 11, when designed and manufactured in this manner will enable virtually round the clock use of housing 11 and solar panel 10, versus conventional solar panels that may be used only during sunlight, to not only generate electrical and thermal energy, but to also provide for cooling aspects as well.

Figure 7:
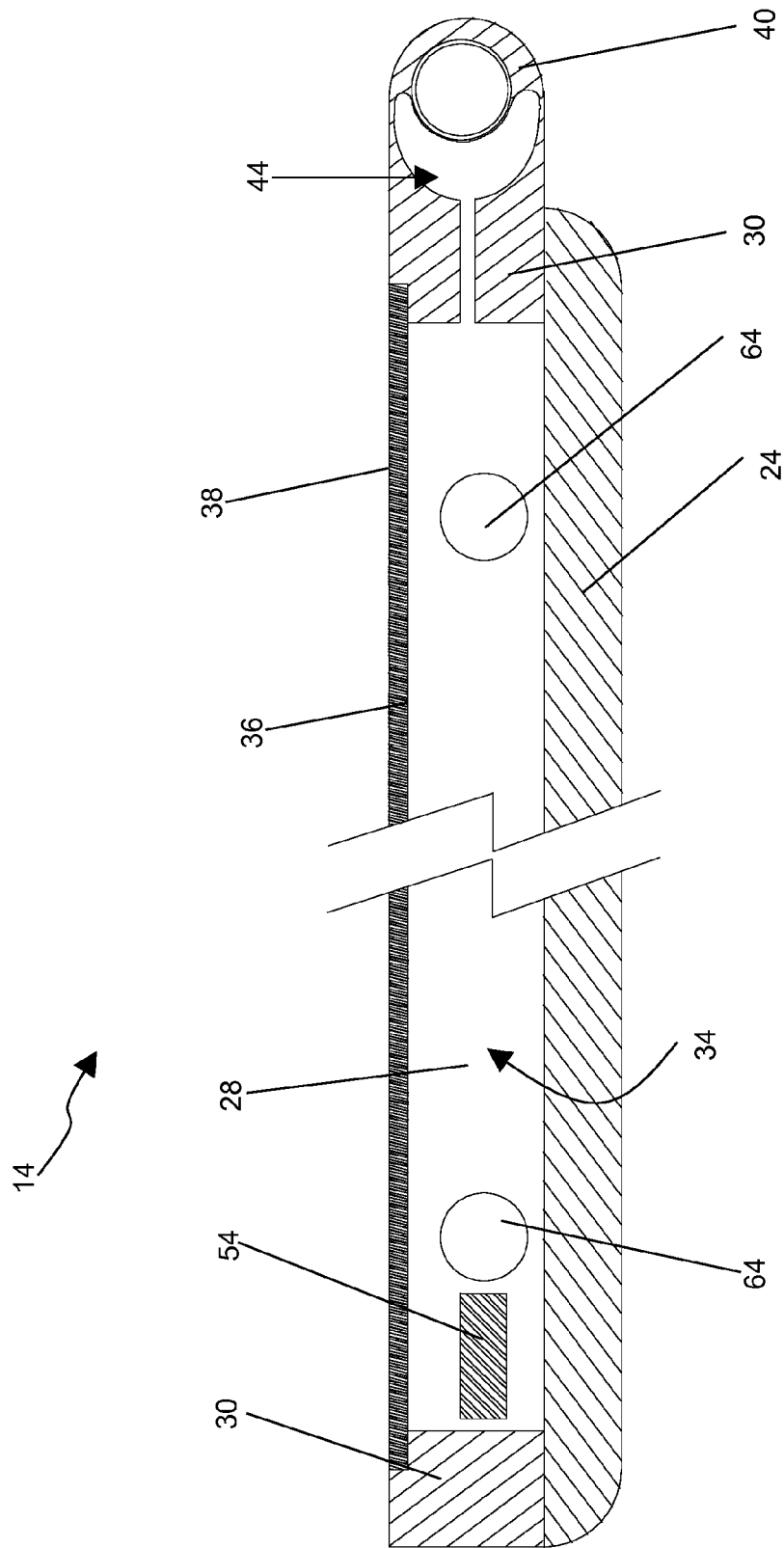
FIG. 7 is a side view of a solar panel housing according to an embodiment of the present invention.

Typically, and as expected, solar panels will tend to increase in heat when exposed to sun. With photovoltaic cells, as is well known in the art, they will tend to operate at an optimal level within a specific temperature range. If the temperature of the cells decrease or increase outside of the range, the cells will begin to operate less efficiently in their operation of converting solar energy to electrical energy. One means to control the overheating of the panels is to allow some ambient or cool air to flow throughout panel 10 and the cells to help maintain the temperature in panel 10 at an optimal level for electrical power generation. In another embodiment of the present invention illustrated in FIG. 7, side walls 26 and 28 as well as bottom end cap 32 may include an aperture 54 that may be covered with bristles to allow the escape of air from solar panel 10 while at the same time helping to limit the amount of air and debris entering solar panel 10. An air flow may be introduced at header 40 through void 44 and directed through holes 56 of header 40 and into cavity 34, across cells 12 and out aperture 54 in an effort to maintain the temperature of cavity 34 at the optimal level for electrical generation.

The same aperture and bristle configuration described above may be used with thermal solar panels as well. In this particular embodiment of the present invention, fluid may be pumped through fin tubes 20 during the night hours. Ambient night air may be introduced through void 44 in header 40 and directed through holes 56, into cavity 34, across fin tubes 20 and out aperture 54. As stated above, when solar panel 10 is used in this manner, the fluid circulating in fin tubes 20 will tend to cool thus providing potable water for drinking, creating ice for storage and use at a later time and cooling residences and commercial buildings.

As stated previously, housing 11 includes glazing 16 that is designed and configured to seat at lip 36 such that cavity 34 may be sealed. Glazing 16 may be configured with any number of layers to adequately seal cavity 34 while providing an optimal pass through of solar radiation to photovoltaic cells 12 and fin tubes 20 to promote the generation of electrical power and thermal energy, respectively.

Figure 8:
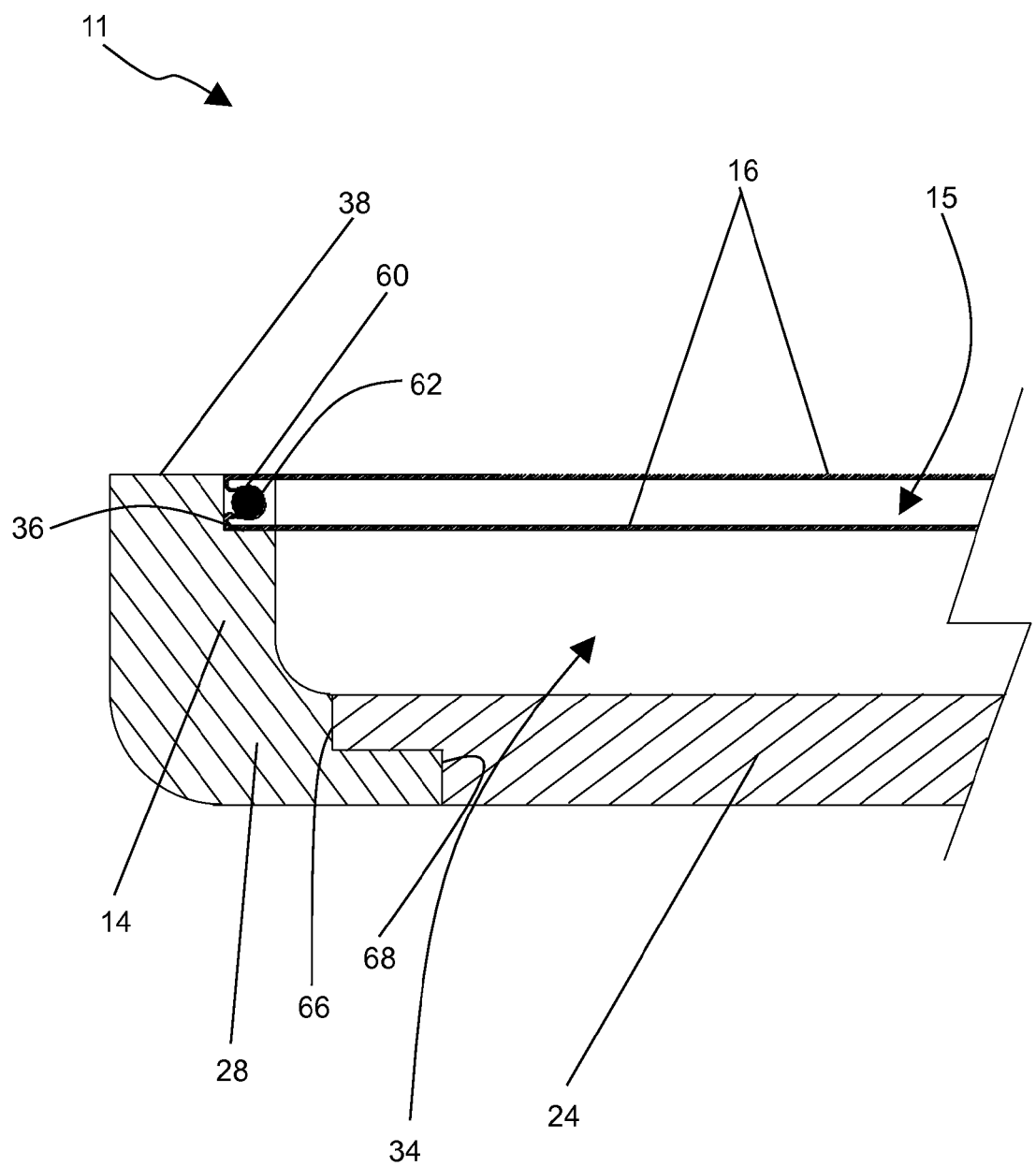
FIG. 8 is a cross-sectional view of a solar panel glazing according to an embodiment of the present invention.

In this particular embodiment of the present invention illustrated in FIG. 8, glazing 16 is configured as two layers. A frame 60 may be configured such that a 'U'-channel 62 is created to capture a portion of glazing 16. Frame 60 may include four sides and may be sized to seat in lip 36 and may be manufactured of any material such as any metal, plastic and the like. In this particular embodiment, glazing 16 may be produced in sheets that are double the size of what may be needed to fit within housing 11. Glazing 16 may be designed in this manner such that when it is folded over upon itself, a double layer of glazing may be created. Frame 60 may be positioned in between the two sheets of glazing, such that a gap 15 may be created between the two sheets of glazing. The folded end of glazing 16 may then be pushed into channel 62 and a piece of rope or the like may be added into channel 62 to seat glazing 16 in channel 62 and on fame 60. The same assembly process may be used to assemble the ends of glazing 16 of the other three sides to frame 60. Once assembled in this manner, glazing 16 and frame 20 may be seated in lip 36 to seal cavity 34.

Figure 9A:
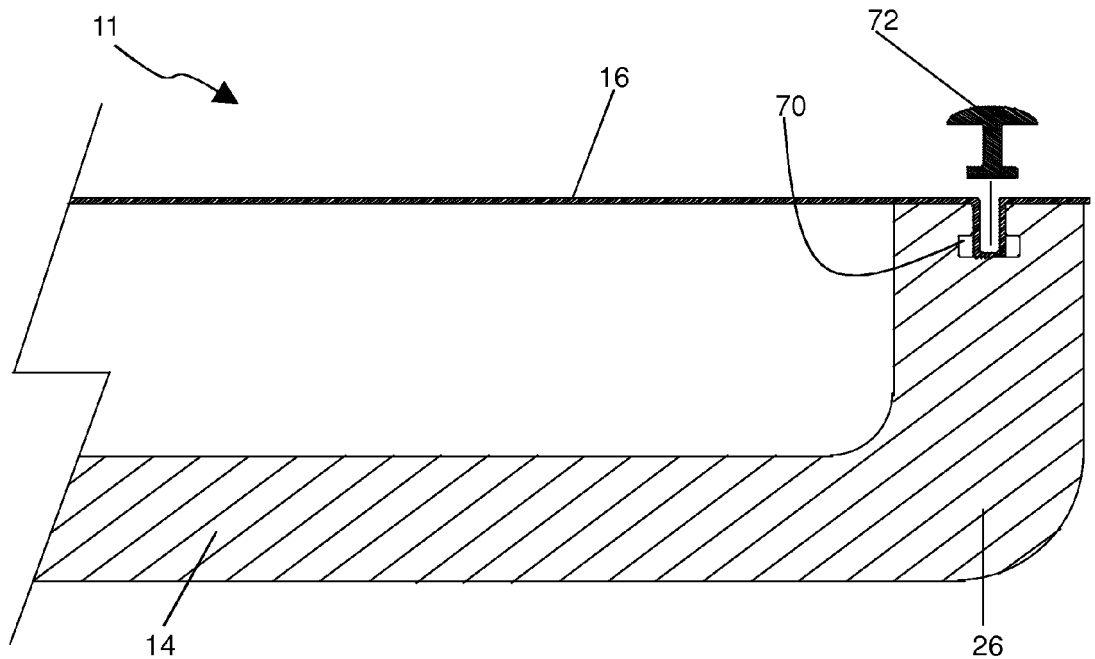
FIGS. 9A and 9B are cross-sectional views of a solar panel housing according to yet another embodiment of the present invention.
Figure 9B:
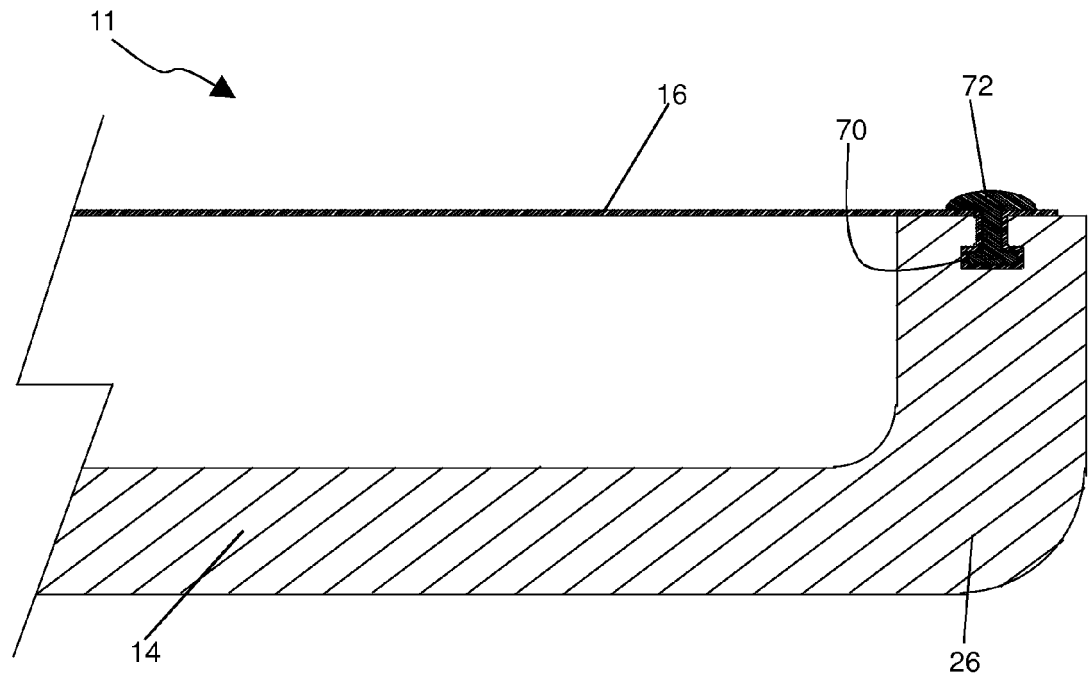

FIGS. 9A-10B illustrate alternative means to secure glazing 16 to tray 14 to create housing 11. In this particular embodiment of the present invention, a trough 70 may be added at top surface 38 to each of side walls 26 and 28, top end cap 30 and bottom end cap 32. Trough 70 may be molded into top surface 38 of each of side walls 26 and 28, top end cap 30 and bottom end cap 32 and sized to accept and secure a trim cap 72, a portion of which may be snapped into trough 70. Alternatively, trough 70 may be a separate metal frame that is secured to top surface 38 with typical fasteners. Trim cap 72 may be configured to extend around the perimeter of tray 14 at trough 70. Alternatively, cap 72 may be configured such that cap 72 may be positioned in trough 70 are selected positions around the perimeter of tray 14. FIGS. 9A and 9B illustrate one exemplary use of cap 72 and trough 70 with a particular type of glazing 16. In this particular illustration, glazing 16 is configured to be captured in trough 70 by cap 72. Glazing 16 may be stretched across cavity 34 and tray 14 and the edges of glazing 16 may be captured in trough 70 by cap 72 thereby securing glazing 16 to tray 14.

Figure 10A:
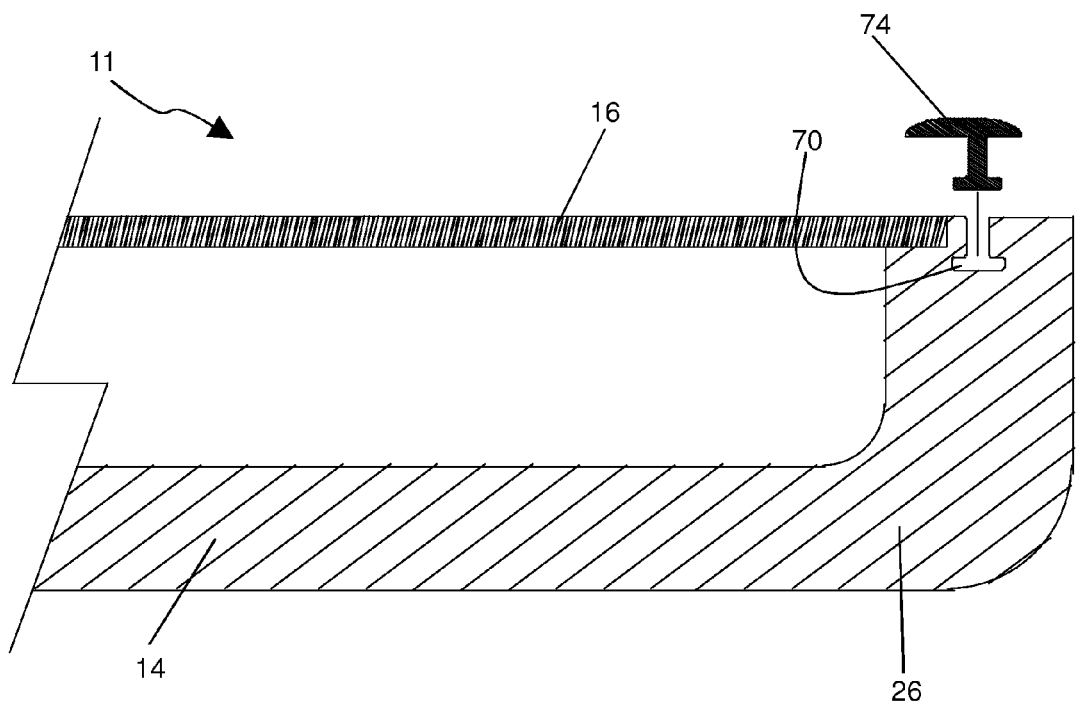
FIGS. 10A and 10B are cross-sectional views of a solar panel housing according to still another embodiment of the present invention.
Figure 10B:
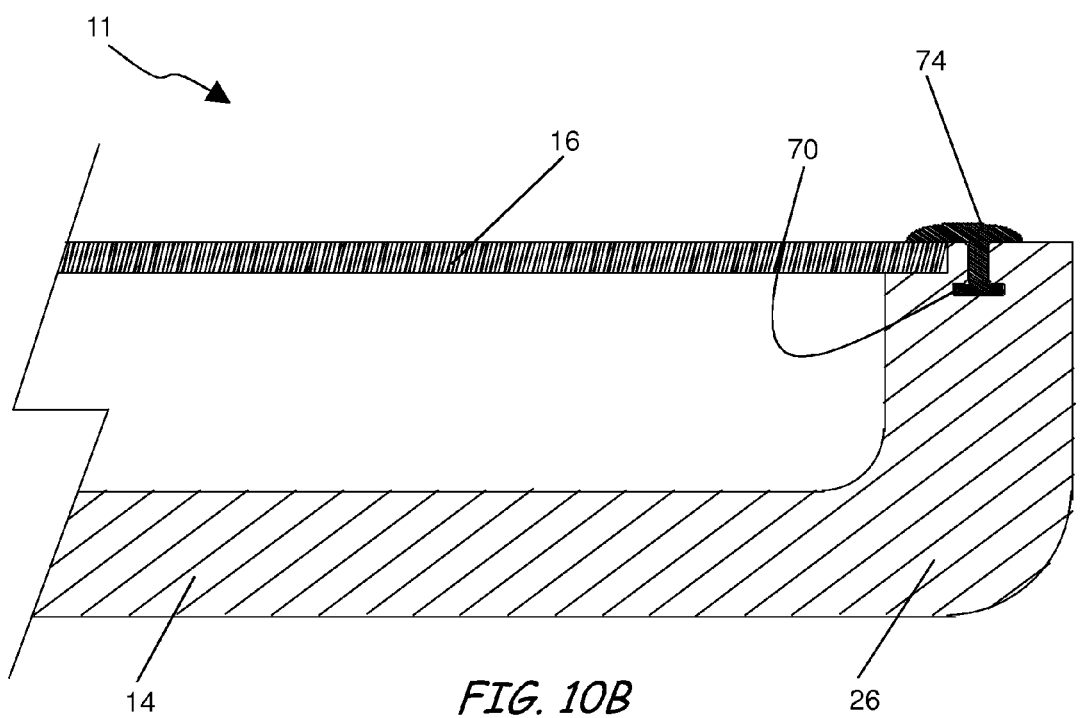

FIGS. 10A and 10B illustrate a further exemplary use of trough 70 and a second trim cap 74. In much the same manner as cap 72 secured glazing 16 to tray 14, second trim cap 74 can also be used to secure glazing 16 to tray 14. In this particular illustration, glazing 16 may be at such a thickness that may prevent glazing 16 from being captured in trough 70 by cap 74. In this instance, cap 74 may be configured such that it captures glazing 16 against lip 36, thereby securing glazing 16 to tray 14. Second trim cap 74 may be configured to engage trough 70 around the entire perimeter of tray 14, or alternatively, second trim cap 74 may be configured such that cap 74 may be positioned at selected locations around the perimeter of tray 14 just as cap 72. In either embodiment, trim cap 72 and second trim cap 74 are configured to engage trough 70 and secure glazing 16 to tray 14 to create housing 11.

Figure 11A:
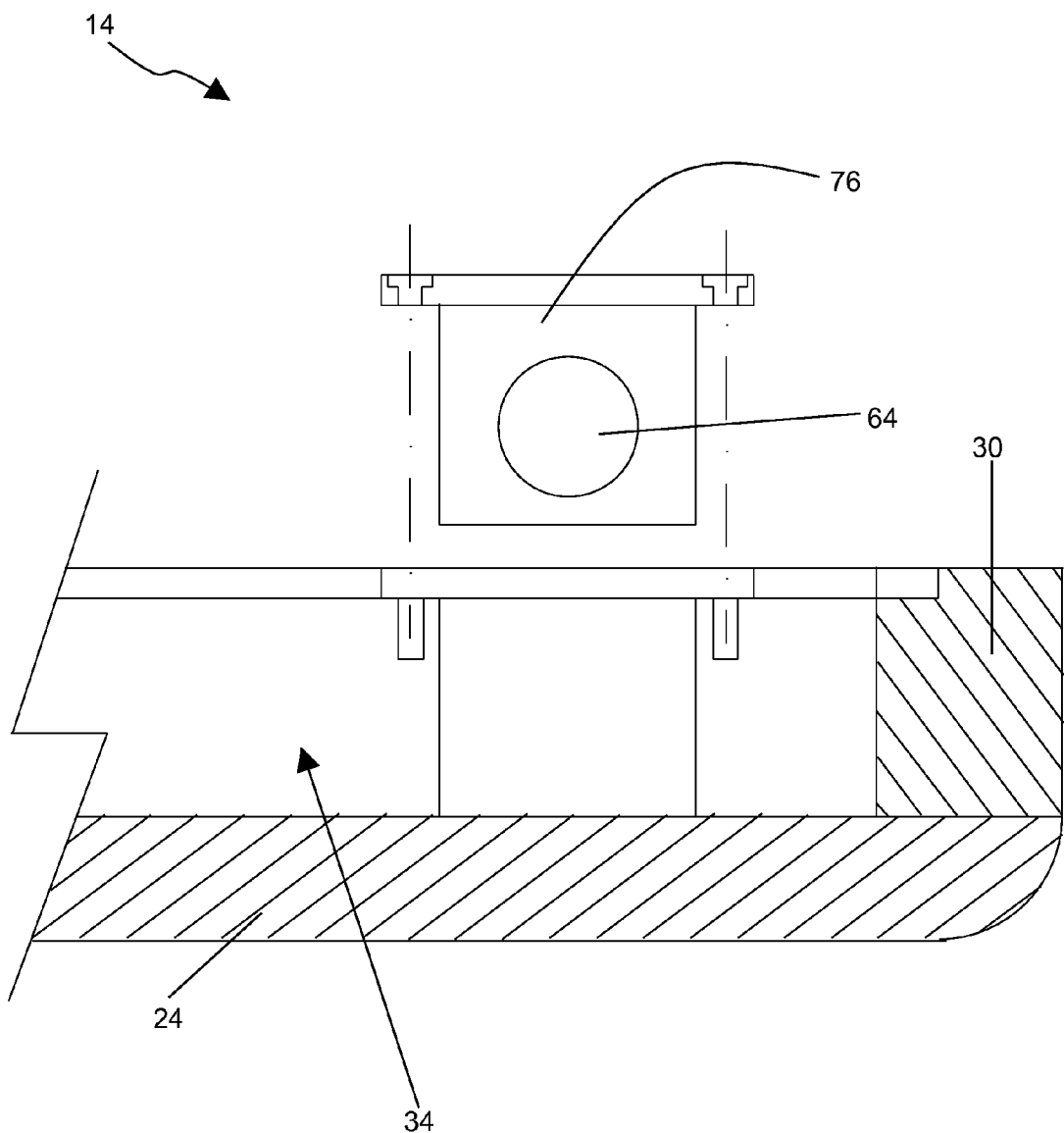
FIGS. 11A and 11B are cross-sectional views of a solar panel housing according to still yet another embodiment of the present invention.
Figure 11B:
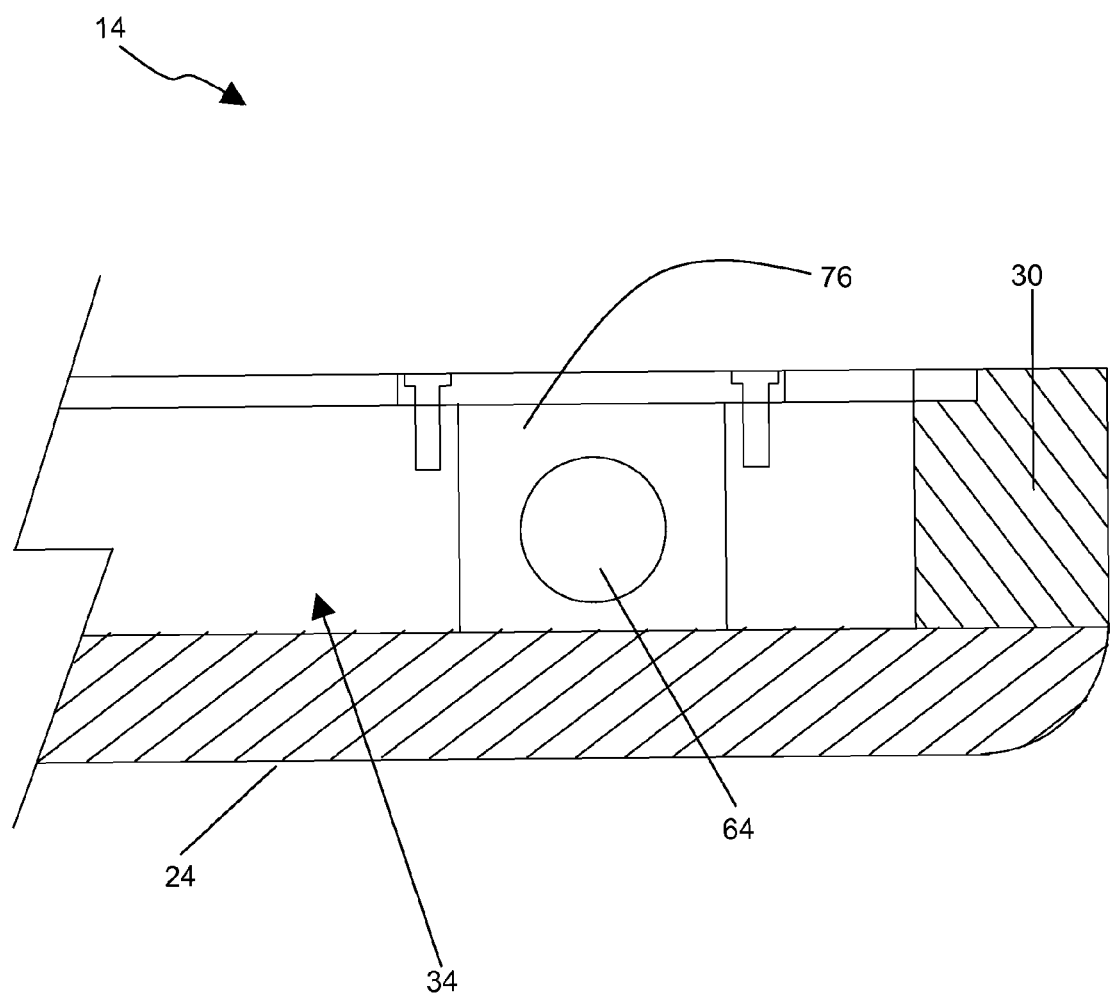

In still yet another embodiment of the present invention illustrated by FIGS. 11A and 11B, tray 14 may include a header key 76. In this particular embodiment, at least one section of tray 14 is configured to accept and secure header key 76. In this instance, header key 76 includes aperture 64 as well as mounting holes to accept fasteners that will allow for header key 76 to be secured to tray 14 (tray 14 includes a mating fastener, such as a molded tapped insert and the like for accepting fasteners that will pass through the fastening holes of header key 76). Header key 76 will allow for interchangeability of the header key with the rest of tray 14. The size and shape of aperture 64 may be varied depending on the size of the conduit of pipe that may pass through aperture 64, or, alternatively, header key may be a solid piece if no aperture is needed. Allowing for header key 76 to be changed out with different types of header keys may provide for uniform manufacturing of tray 14 in an effort to lower costs and reduce material use. The trays can be manufactured to one standard or size and various, smaller, header keys may be produced and easily added to trays or exchanged with other header keys to meet the component requirements of the job.

Housing 11 has been described above having a number of improvements that will ensure the optimal operation of any solar panel during both the sunlight and evening hours as well. The functional design aspects of housing 11 along with the operational aspects for solar panel 10 described above take advantage of our abundant renewable resources and will help to ensure that we can extend the life of our limited natural resources.

The present invention has been particularly shown and described with reference to the foregoing embodiment, which is merely illustrative of the best modes presently known for carrying out the invention. It should be understood by those skilled in the art that various alternatives to the embodiment of the invention described herein may be employed in practicing the invention without departing from the spirit and scope of the invention as defined in the following claims. It is intended that the following claims define the scope of the invention and that the method within the scope of these claims and their equivalents be covered thereby. This description of the invention should be understood to include all novel and non-obvious combination of elements described herein, and claims may be presented in this or a later application to any novel non-obvious combination of these elements. Moreover, the foregoing embodiment is illustrative, and no single feature or element is essential to all possible combinations that may be claimed in this or a later application.

What is claimed is:

1. A housing for a solar panel comprising:
    a glazed element; and
    a tray; said tray including:
        a plate;
        a pair of side walls extending generally vertical from said plate, said pair of side walls include at least one first aperture, said at least one first aperture configured to allow passage of a tube or conduit;
        a top end cap;
        a bottom end cap;
        a top surface of said pair of side walls, said top end cap and said bottom end cap;
        a lip, said lip positioned proximate the junction of said top surface of said pair of side walls, said top end cap and said bottom end cap and an interior wall of said pair of side walls, said top end cap and said bottom end cap, said lip including a seating surface that is positioned below said top surface of said pair of side walls, said top end cap and said bottom end cap, said lip extending the interior perimeter of each of said pair of side walls, said top end cap and said bottom end cap, and said lip configured to seat said glazed element such that a top surface of said glazed element is flush to said top surface of said pair of side walls, said top end cap and said bottom end cap;
    wherein said plate, said pair of side walls, said top end cap, said bottom end cap, said top surface of said pair of side walls, said top end cap and said bottom end cap and said lip are formed of a single material and configured as a single integral component;
    wherein said plate, said pair of side walls, said top end cap and said bottom end cap are collectively configured to form a cavity; and
    wherein said top end cap is configured to include a top header, said top header configured such that said top end cap is positioned between said top header and said cavity, said top header including:
        at least one pipe extending outwardly from said top header at both side ends of said top header and extending a length of said top header and throughout an interior space of said top header; and
        at least one void extending a length of said top header and throughout the interior space of said top header, said void positioned proximate said pipe and distinct from said pipe.

2. The housing as recited in claim 1, wherein said glazed element is configured to engage said lip and encase said cavity.

3. The housing as recited in claim 1, wherein said single material of said plate, said pair of side walls, said top end cap said bottom end cap said top surface of said pair of side walls, said top end cap and said bottom end cap and said lip is a polystyrene foam.

4. The housing as recited in claim 3, wherein said tray is encased in a coating to protect said tray from the weather elements.

5. The housing as recited in claim 1, wherein said single material of said plate, said pair of side walls, said top end cap said bottom end cap said top surface of said pair of side walls, said top end cap and said bottom end cap and said lip is a weather resistant plastic.

6. The housing as recited in claim 1, wherein said top header is configured to further include
    a first metallic plate extending the length of the interior space of said top header, said at least one pipe positioned proximate said first metallic plate;
    a second metallic plate extending the length of the interior space of said top header, said second metallic plate positioned proximate said cavity;
    a thermoelectric device extending the length of the interior space of said top header, said thermoelectric device positioned and secured in between said first metallic plate and said second metallic plate; and
    wherein a first fluid having a first temperature gradient may be passed though said first pipe and a second fluid having a second temperature gradient, which is different than the first temperature gradient, may be passed through said cavity to create a temperature differential across said first metallic plate and said second metallic plate to induce a flow of electricity in said thermoelectric device.

7. The housing as recited in claim 1, wherein said pair of side walls further include at least one second aperture, said second aperture configured to facilitate the flow of air into said void, throughout the entirety of said cavity and out said second aperture of said housing.

8. The housing as recited in claim 1, wherein said glazed element may include multiple layers, said multiple layers of said glazed element being separated by a gap.

9. The housing as recited in claim 8, wherein said multiple layers of said glazed element are configured to be secured to a frame, said frame being separate and distinct from said housing.

10. The housing as recited in claim 9, wherein said frame includes
    a 'U'-channel, said 'U'-channel extending the outer perimeter of said frame and configured to capture a portion of said glazed element;
    a securement means to seat and secure said glazed element to said frame; and
    wherein said glazed element is configured to be at least two times the size of said housing such that said glazed element may be folded about itself and said frame may be inserted between said multiple layers of said glazed element to create said gap between said multiple layers of said glazed element.

11. The housing as recited in claim 9, wherein said frame is configured to engage said lip and encase said cavity.

12. The housing as recited in claim 1, wherein said tray includes
    at least one detachable first header key, said detachable first header key including said at least one first aperture, said first aperture being a first size;
    at least one detachable second header key, said detachable second header key including at least one second aperture, said second aperture being a second size; and
    wherein said detachable first header key is interchangeable with said detachable second header key to vary the sizes of said first aperture and said second aperture with respect to said tray to accommodate various sizes of said tube or said conduit.

13. The housing as recited in claim 12, wherein said tray includes at least one detachable third header key, said detachable third header key being solid and wherein said detachable third header key is interchangeable with said detachable first header key and said detachable second header key.

14. The housing as recited in claim 1, wherein said tray includes a trough, said trough molded into said top surface of said pair of side walls, said top end cap and said bottom end cap, said trough extending a perimeter of said tray at said top surface and said trough configured to capture a portion of said glazed element.

15. The housing as recited in claim 14, wherein said housing further includes a trim cap, said trim cap configured to engage said trough and secure said glazed element to said tray.

\* \* \* \* \*